United States Patent
Roth et al.

(10) Patent No.: US 7,514,634 B2
(45) Date of Patent: Apr. 7, 2009

(54) REINFORCED SUPERCONDUCTOR ELEMENT

(75) Inventors: Gerhard Roth, Rheinstetten (DE); Helmut Krauth, Hanau (DE)

(73) Assignee: Bruker EAS GmbH, Hanau (DE)

( * ) Notice: Subject to any disclaimer, the term of this patent is extended or adjusted under 35 U.S.C. 154(b) by 415 days.

(21) Appl. No.: 11/179,589

(22) Filed: Jul. 13, 2005

(65) Prior Publication Data
US 2009/0050348 A1   Feb. 26, 2009

(30) Foreign Application Priority Data
Jul. 23, 2004   (DE)   .................. 10 2004 035 852

(51) Int. Cl.
*H01B 12/00* (2006.01)
(52) U.S. Cl. .................. 174/125.1; 174/15.4
(58) Field of Classification Search ............. 174/125.1, 174/15.4
See application file for complete search history.

(56) References Cited

U.S. PATENT DOCUMENTS

| 3,996,661 | A |   | 12/1976 | Ziegler |   |
| 4,402,768 | A |   | 9/1983 | Fluekiger |   |
| 5,324,891 | A | * | 6/1994 | Huang et al. | 174/15.4 |
| 2006/0207787 | A1 | * | 9/2006 | Benz et al. | 174/125.1 |
| 2008/0146451 | A1 | * | 6/2008 | Chen et al. | 505/231 |

FOREIGN PATENT DOCUMENTS

| EP | 0 484 902 | 5/1992 |
| GB | 1 394 724 | 5/1973 |
| GB | 1 394 724 | 5/1975 |
| GB | 1 535 971 | 12/1978 |
| GB | 1 543 149 | 3/1979 |
| JP | 8 287748 | 11/1996 |

(Continued)

OTHER PUBLICATIONS

Wong, Terence et al., "Ti and Ta Additions to Nb3Sn by the Powder in Tube Process", IEEE Transactions on Applied Superconductivity, vol. 11, No. 1, Mar. 2001.*

(Continued)

*Primary Examiner*—Dean A. Reichard
*Assistant Examiner*—Yuriy Semenenko
(74) *Attorney, Agent, or Firm*—Paul Vincent

(57) ABSTRACT

A superconductor element comprising $Nb_3Sn$, in particular, multi-filament wire, which contains at least one superconducting filament (1) which is obtained after drawing through solid diffusion reaction from an initial filament structure which comprises a longitudinal hollow tube (3) of niobium (Nb) or an Nb alloy, in particular, NbTa or NbTi, with an inner surface (8) and an outer surface (9), wherein the tube (3) is embedded into a thermally and electrically highly conducting metal matrix (2), in particular, of copper (Cu), wherein the tube (3) is filled with a material (4) which contains tin (Sn) is characterized in that, for mechanical reinforcement of the conductor element and as a diffusion barrier during solid diffusion reaction, the outer surface (9) of the tube (3) is directly and completely surrounded by a sleeve (7) made from a metallic material which has, at room temperature, a thermal expansion coefficient $\alpha_{sheet} < 17 \ast 10^{-6} K^{-1}$, preferably $\alpha_{sheet} < 8 \ast 10^{-6} K^{-1}$, an elastic limit $R_{p0.2} > 300$ MPa and a cross-sectional reduction A>20%, wherein the metallic material is selected to be chemically inert to diffusing tin (Sn) up to a reaction temperature T of the solid diffusion reaction.

19 Claims, 2 Drawing Sheets

FOREIGN PATENT DOCUMENTS

WO      WO 93/02478      2/1993

OTHER PUBLICATIONS

M. Suenaga and A. F. Clark, "Proceedings of the Topical Conference on A15 Superconductors", Plenum Press, New York, (1980).

European Advanced Superconductors "NbSn Superconductors" www.bruker.de/eas/pdf/eas_lts.pdf.

Terence Wong and Charles V. Renaud "Ti and Ta Additions to $Nb_3Sn$ by the Powder in Tube Process". IEEE Transactions on Applied Superconductivity, vol. 11, No. 1, Mar. 2001.

Wong, Terence et al. "Ti and Ta Additions to $Nb_3Sn$ by the Powder in Tube Process". IEEE Transactions on applied superconductivity, vol. 11, No. 1, Mar. 2001.

* cited by examiner

REINFORCED SUPERCONDUCTOR ELEMENT

This application claims Paris Convention priority of DE 10 2004 035 852.4 filed Jul. 23, 2004 the complete disclosure of which is hereby incorporated by reference.

BACKGROUND OF THE INVENTION

The invention concerns a superconductor element comprising $Nb_3Sn$, in particular, a multi-filament wire, which contains at least one superconducting filament which is obtained after drawing via a solid diffusion reaction from an initial filament structure which comprises a longitudinal hollow tube of niobium or a niobium alloy, in particular, NbTa or NbTi with an inner surface and an outer surface, wherein the tube is embedded in a thermally and electrically highly conductive metal matrix, in particular, of copper, the tube being filled with a material containing tin.

Superconductor elements comprising $Nb_3Sn$ are generally produced through a PIT (power-in-tube) process. Since the $Nb_3Sn$ alloy is extremely brittle, it cannot be subjected to a drawing process. If it is nevertheless desired to produce a superconductor element from this material having excellent superconducting properties, a tube containing niobium is initially filled with tin powder and is drawn followed by formation of $Nb_3Sn$ via a diffusion process. The tin contained in the powder thereby diffuses into the niobium tube.

Superconductor elements produced through PIT processes are often used to produce superconducting coils. For large current densities and large magnetic fields, coils of this type are subjected to large Lorentz forces which must be accommodated by the conductor without being damaged. This is a substantial problem, in particular, with extremely thin filaments. To ensure stable operation of the superconductor elements, the filaments should be as thin as possible. The filigree design of the filaments creates problems with respect to their stability. Moreover, during drawing, the cross-sectional shape of the inner surface of the niobium tube does not change in the same manner as its outer surface. In consequence thereof, the wall thickness of the niobium tube can vary at various locations after the drawing process and the tin which diffuses through the niobium tube reaches the copper matrix at different speeds and may even diffuse into the copper matrix and reduce the conductivity of the copper, which impairs the load capability of the filament. For this reason, the amount of tin is usually minimized to prevent diffusion of the tin into the copper matrix. However, not all of the available niobium material can thereby react to form $Nb_3Sn$ and correspondingly smaller amounts of superconducting material are thereby produced. Alternatively, one must provide a correspondingly larger amount of initial material. This increases the diameter of the filaments.

The documents "Filamentary A15 Superconductors" Masaki Suenaga; Alan F. Clark; PLENUM PRESS NEW YORK AND LONDON, 1980; pages 17-22 and the data sheet "Low-temperature superconductors" of the company European Advanced Superconductors GmbH & Co. KG (see website bruker.de/eas) disclose superconductor elements havnig niobium filaments embedded in a bronze matrix, wherein the bronze matrix is surrounded by a highly conductive copper layer. To avoid tin impurities in the copper, a tantalum foil is provided as a diffusion barrier and is disposed between the bottom matrix and the copper.

It is the object of the present invention to propose a superconductor element produced by a PIT process with improved stability and high current-carrying capacity. A further object of the invention consists in proposing a method for producing a superconductor element of this type.

SUMMARY OF THE INVENTION

This object is achieved in accordance with the invention in that, for mechanical reinforcement of the conductor element and as a diffusion barrier, the outer surface of the tube is directly and completely surrounded by a sleeve of metallic material which has, at room temperature, a thermal expansion coefficient $\alpha_{sleeve}<17*10^{-6}K^{-1}$, preferably $\alpha_{sleeve}\leq 8*10^{-6} K^{-1}$, an elastic limit $R_{p0.2}>300$ MPa and a cross-sectional reduction A>10%, wherein the metallic material is chemically inert to diffused tin, up to a reaction temperature T of the solid diffusion reaction temperature.

The metal tube mechanically stabilizes the filament and can at least partially bear the forces acting on the filament. The metallic material moreover prevents diffusion of tin into the copper matrix. A sufficient supply of tin-containing powder can be provided inside the hollow tube such that the entire niobium of the hollow tube can react to form $Nb_3Sn$. The conductivity of the highly-conductive copper matrix is thereby not negatively influenced while, at the same time, maximum yield of superconducting $Nb_3Sn$ is realized. In total, an extremely stable superconductor element having high current carrying capacity is obtained.

In a preferred embodiment, the sleeve surrounding the tube comprises tantalum or a tantalum alloy. This is particularly advantageous since the properties of tantalum excellently meet the requirements of the above-specified metal. Tantalum has a low thermal expansion coefficient and an elastic limit which is large enough to withstand drawing in a PIT process.

The advantageous properties of tantalum can be utilized with particular preference if the sleeve surrounding the tube comprises tantalum of an atomic concentration of $C_{TA, sleeve}\geq 50\%$, preferably $C_{TA, sleeve}\geq 90\%$.

In a further embodiment of the inventive conductor element, the sleeve surrounding the tube additionally comprises tungsten and/or molybdenum and/or titanium and/or vanadium and/or niobium. These materials are especially suited for the intended application due to their high melting points.

In a particularly advantageous manner, the material located in the tube comprises a powder. A large amount of powder can be filled in to provide the inventive conductor element with a high current-carrying capacity following diffusion into the niobium tube and formation of $Nb_3Sn$.

In a preferred embodiment, the material in the tube contains copper. This has a positive influence on the diffusion of the tin into the niobium tube.

In a further embodiment, the powder located in the tube contains $NbSn_2$.

In a particularly preferred manner, the inner surface of the tube is coated with copper or is lined with a copper sheet. During heating, the copper of the sheet alloys with the tin powder to form bronze. Formation of bronze against has a positive effect on promoting further diffusion of tin into the niobium tube.

For use of the inventive conductor element in connection with superconducting coils, the tube preferably has a maximum outer diameter $d_{max, R}$ after drawing of 3 $\mu m \leq d_{max, R} \leq 100 \mu m$, preferably of $10 \mu m \leq d_{max, R} \leq 50 \mu m$. Condctor elements of this type are thin enough to ensure stable operation.

The conductor elements typically comprise a tube having a wall thickness $W_{tube}$ after drawing of $5 \mu m < W_{tube} < 20 \mu m$. For selection of the wall thickness of the niobium tube, the desired diameter of the superconducting filament to be produced and also the insertion depth of the tin are important, since $Nb_3Sn$ is no longer formed in the outer region of very thick niobium tubes due to the limited penetration depth of the tin, thereby leaving unreacted niobium material.

To ensure sufficient stability of the inventive conductor element, the sleeve surrounding the tube preferably has a thickness $d_H$ after drawing of 3 μm<$d_H$<15 μm.

The inventive conductor element can be produced by a method with which the outer surface of the tube is completely and directly surrounded by a sleeve of metallic material before drawing for mechanical reinforcement of the conductor element and as diffusion barrier during solid diffusion reaction, wherein the sleeve has, at room temperature, a thermal expansion coefficient $\alpha_{sheet}$<$17*10^{-6}K^{-1}$, preferably $\alpha_{sheet}$<$8*10^{-6}K^1$, an elastic limit $R_{p0.2}$>300 MPa and a cross-sectional reduction A>20%, wherein the metallic material is selected to be chemically inert to diffusing tin up to a reaction temperature T of the solid diffusion reaction temperature.

In an advantageous variant of the method, the solid diffusion reaction is performed at a reaction temperature T of 400° C.≦T≦800° C., preferably 550° C.≦T≦700° C., wherein the solid diffusion reaction is performed, in particular, using HIP (high temperature isostatic pressing) thereby obtaining a rapid and effective niobium-tin reaction.

In an advantageous variant of the inventive method, the solid diffusion reaction is performed in an oxygen-free atmosphere with an oxygen partial pressure of $p_{o2}$≦$10^{-3}$ mbar, in particular, under vacuum or in an inert gas atmosphere which preferably contains argon and/or nitrogen to eliminate undesired oxidation processes.

In a particularly advantageous manner, the reaction conditions of the solid diffusion reaction, in particular, the reaction temperature T, the reaction time t, and/or the heating rate R are selected such that the entire niobium located in the tube of the initial filament structure reacts into $Nb_3Sn$ thereby generating a maximum amount of superconducting material to effect high conductivity of the inventive conductor element.

In a further variant of the inventive method, the reaction conditions of the solid diffusion reaction, in particular, the reaction temperature T, the reaction time t and/or the heating rates R are selected such that the atomic concentration of the tin in the $Nb_3Sn$ phase of the superconducting filament is at least 23%, preferably at least 24%. This high tin concentration is desired to improve the superconducting properties of the Nb3Sn, in particular, the critical temperature and the critical field strength.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

DESCRIPTION OF THE PREFERRED EMBODIMENT

Figure 1:
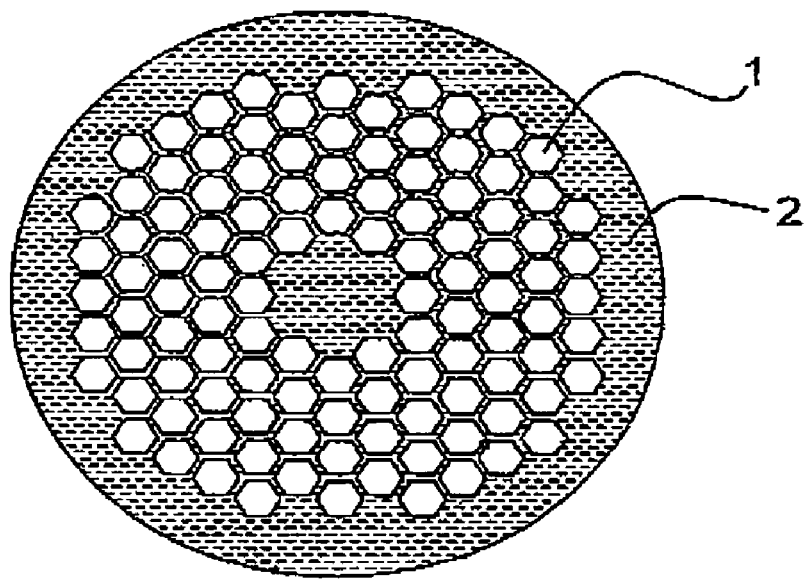
FIG. 1 shows a schematic view of a superconductor element with a plurality of filaments.

FIG. 1 shows a superconductor element comprising a plurality of filaments 1 which are embedded in a metal matrix 2 (e.g. of copper). The hexagonal filament cross-sections are formed through drawing. The filaments 1 comprise a longitudinal tube 3 which contains niobium, and are filled with a powder 4 comprising components which can diffuse into the tube 3 to generate a superconducting material (preferably an $Nb_3Sn$ layer 5). Tin or a tin alloy are particularly suited as the powder material. Diffusion of tin into the niobium tube 3 is particularly enhanced if the tin is provided in the form of bronze. Since bronze can be loaded with tin only up to 15%, the powder used is generally not pure bronze powder but bronze mixed with tin. Another possibility to support the diffusion process consists in coating the inner surface 8 of the tube 3 with copper or lining it with a copper sheet (not shown). Through heating during the solid diffusion reaction, part of the tin powder 4 forms alloys with the copper coating to form bronze and further promote diffusion of the tin out of the powder 4 and into the niobium tube 3.

Figure 2:
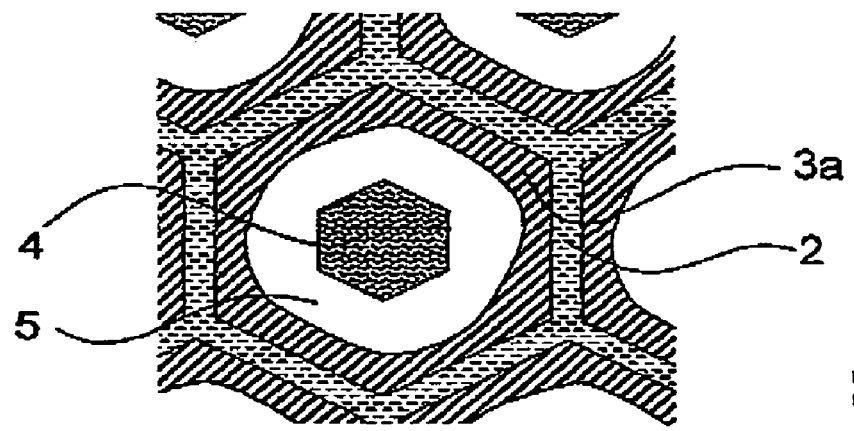
FIG. 2 shows a schematic view of a section of a superconductor element in accordance with FIG. 1 after a solid diffusion reaction.

As shown in FIG. 2, in conventional conductor elements, the entire tube 3 does not react into an $Nb_3Sn$ phase 5 but an unreacted layer 3a of the tube material remains around the superconducting Nb3Sn phase 5. If the amount and concentration of the tin in the powder 4 or the wall thickness of the tube 3 is selected such that the entire amount of Nb contained in the tube 3 reacts into $Nb_3Sn$, tin could diffuse out of the powder 4 and into the metal matrix 2 thereby having a negative influence on the conductivity of the metal matrix 2 and on the stability of the conductor element.

Figure 3:
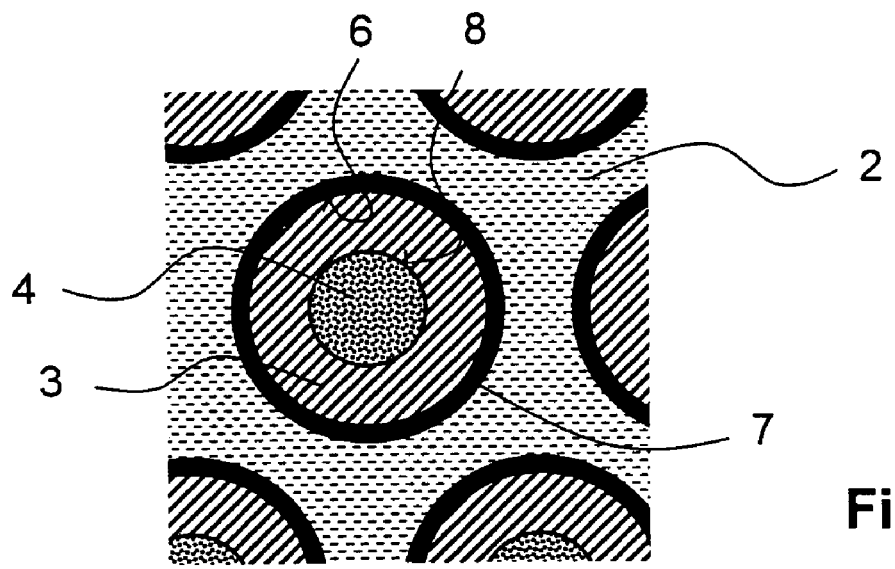
FIG. 3 shows a schematic view of an initial filament structure of a superconductor element in accordance with the present invention.

To increase the stability of the filaments 1 of a superconductor element, the inventive conductor element has a stabilizing metallic sleeve 6 disposed around the outer surface 9 of the tube 3 (FIG. 3). The metallic material of the sleeve 6 must have a sufficiently small expansion coefficient and a sufficiently large elastic limit and cross-sectional reduction to prevent damage to the sleeve 6 during stretching and thermal treatment of the initial filament structure. Moreover, the metallic material of the sleeve 6 must be sufficiently strong after solid diffusion reaction to stabilize the superconducting filaments 1. Tantalum or copper titanium are suitable materials for such a stabilizing sleeve 6. While copper titanium has a stabilizing effect on the filaments 1 merely due to its mechanical properties, a tantalum sleeve 6 has the further advantage that it can also serve as a diffusion barrier to prevent diffusion of tin out of the powder 4 and into the metal matrix 2. A combination of different materials for the sleeve is, of course, also feasible.

Figure 4:
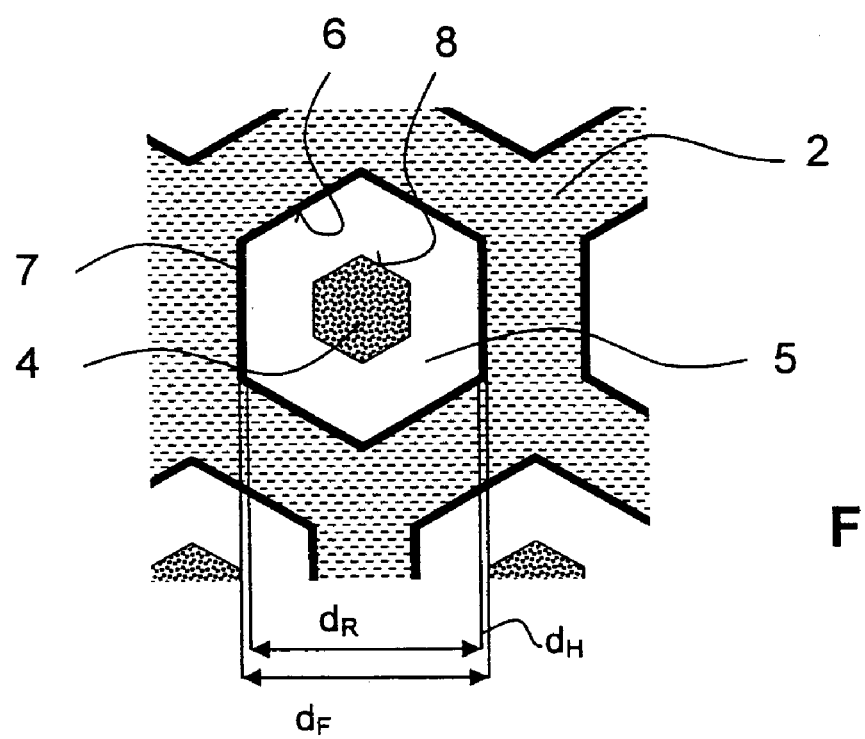
FIG. 4 shows a schematic view of a section of a superconductor element in accordance with the present invention after solid diffusion reaction.

FIG. 4 shows a filament 1 of an inventive conductor element, wherein the entire amount of niobium contained in the tube 3 has reacted to $Nb_3Sn$. The inventive sleeve 6, which is chemically inert to diffusing tin, prevents tin from entering into the metal matrix, thereby ensuring effective reaction of the Nb material into a superconducting $Nb_3S$ phase 5. The inventive sleeve 6 thereby directly stabilizes the filaments 1 through its reinforcing mechanical properties, as well as indirectly in that the sleeve 6 prevents diffusion of tin into the metal matrix 2, thereby avoiding a reduction in the conductivity of the conductor element and an associated reduced load capacity. The inventive stabilization permits use of thinner tubes 3 for the inventive conductor element and production of a controlled amount of $Nb_3Sn$, namely by selecting the wall thickness $W_R$ of the tube 3 in such a manner that the entire amount of niobium located in the tube 3 can react with the tin of the powder 4 to form a superconducting $Nb_3Sn$ phase 5 (FIG. 4). The diameter $d_F$ of the filament 1 is given by the diameter $d_R$ of the tube 3 and twice the thickness $d_H$ of the sleeve 6.

$$d_F = d_R + 2d_H$$

The reduced diameter $d_R$ of the tube and the additionally provided reinforcing sleeve 6 produce a conductor element with increased strength compared to conventional filament structures for a comparable overall diameter $d_F$ of the filaments 1, which can be used e.g. for MR applications to generate higher magnetic fields. Effective utilization of the sleeve material produces, in total, a highly mechanically robust superconductor element having a small diameter.

LIST OF REFERENCE NUMERALS 1 filament
2 metal matrix
3 tube
3a unreacted layer
4 powder
5 Nb$_3$Sn phase
6 outer surface of the tube
7 sleeve
8 inner surface of the tube

We claim:

1. A superconductor element comprising Nb$_3$Sn, the conductor element having at least one superconductor filament which is obtained after drawing via a solid diffusion reaction of an initial filament structure, the initial filament structure comprising:
   a thermally and electrically highly conducting metal or a copper matrix;
   a sleeve of a metallic material embedded in said matrix, said sleeve having a room temperature expansion coefficient $\alpha_{sheet}<17*10^{-6}K^{-1}$, an elastic limit $R_{p0.2}>300$ Mpa, and a cross sectional reduction A>20%, said metallic material being chemically inert to diffusing tin up to a reaction temperature of the solid diffusion reaction;
   an elongated hollow tube of niobium or a niobium alloy, said tube having an inner surface and an outer surface, said outer surface cooperating with an inner surface of said sleeve,
   wherein said sleeve directly and completely surrounds said outer tube surface as a diffusion barrier during the solid diffusion reaction, said sleeve structured and dimensioned to have a thickness $d_{sleeve}$ after drawing of 3 µm<$d_{sleeve}$<15 µm for mechanical reinforcement of the conductor element,
   wherein a cross sectional area of said sleeve is >11% of an overall cross sectional area of the filament; and
   a powder material disposed within said tube in contact with said tube inner surface, said powder material comprising NbSn$_2$.

2. The conductor element of claim 1, wherein the conductor element is a multi-filament wire and wherein $\alpha_{sheet}<8*10^{-6}K^{-1}$.

3. The conductor element of claim 1, wherein said sleeve surrounding said tube comprises tantalum or a tantalum alloy.

4. The conductor element of claim 3, wherein said sleeve surrounding said tube comprises tantalum in an atomic concentration of $C_{Ta,\ sleeve} \geq 50\%$, or $C_{Ta,\ sleeve} \geq 90\%$.

5. The conductor element of claim 3, wherein said sleeve surrounding said tube comprises tungsten, molybdenum, titanium, vanadium, and/or niobium.

6. The conductor element of claim 1, wherein said material located in said tube contains a powder.

7. The conductor element of claim 1, wherein said material located in said tube contains copper.

8. The conductor element of claim 6, wherein said powder located in said tube contains NbSn$_2$.

9. The conductor element of claim 1, wherein said inner surface of said tube is coated with copper or is lined with a copper sheet.

10. The conductor element of claim 1, wherein said tube has a maximum outer diameter $d_{max,\ R}$ after drawing of 3 µm $\leq d_{max,\ R} \leq$ 100 µm or of 10 µm $\leq d_{max,\ R} \leq$ 50 µm.

11. The conductor element of claim 1, wherein said tube has a wall thickness $W_{tube}$ after drawing of 1 µm<$W_{tube}$<20 µm.

12. A method for producing a superconductor element comprising Nb$_3$Sn, the conductor element havnig at least one superconductor filament which is obtained after drawing via a solid diffusion reaction of an initial filament structure, the method comprising the steps of:
   a) selecting a thermally and electrically highly conducting metal or a copper matrix;
   b) embedding a sleeve of a metallic material in the matrix, the sleeve having a room temperature expansion coefficient $\alpha_{sheet}<17*10^{-6}K^{-1}$, an elastic limit $R_{p0.2}>300$ Mpa, and a cross sectional reduction A>20%, the metallic material being chemically inert to diffusing tin up to a reaction temperature of the solid diffusion reaction;
   c) disposing an elongated hollow tube of niobium or a niobium alloy such that an outer surface of the tube cooperates with an inner surface of the sleeve, wherein the sleeve directly and completely surrounds the outer tube surface as a diffusion barrier during the solid diffusion reaction, said sleeve structured and dimensioned to have a thickness $d_{sleeve}$ after drawing of 3 µm<$d_{sleeve}$<15 µm for mechanical reinforcement of the conductor element, wherein a cross sectional area of said sleeve is >11% of an overall cross sectional area of the filament; and
   d) disposing a powder material within the tube to contact an inner surface of the tube, said powder material comprising NbSn$_2$.

13. The method of claim 12, wherein the solid diffusion reaction is performed at a reaction temperature T of 400° C.$\leq$T$\leq$800° C. or of 550° C.$\leq$T$\leq$700° C., wherein an HIP process (high temperature isostatic pressing) is utilized.

14. The method of claim 13, wherein said high temperature isostatic pressing precedes the solid diffusion reaction.

15. The method of claim 12, wherein the solid diffusion reaction is performed in an oxygen free atmosphere having an oxygen partial pressure of $p_{O2} \leq 10^{-3}$ mbar.

16. The method of claim 15, wherein the solid diffusion reaction is performed under vacuum, in an inert gas atmosphere, in argon, in helium, and/or in nitrogen.

17. The method of claim 12, wherein reaction conditions of the solid diffusion reaction are selected such that an entire amount of niobium located in said tube of the initial filament structure reacts into Nb$_3$Sn.

18. The method of claim 17, wherein the reaction conditions comprise at least one of a reaction temperature T, a reaction time t, and a heating rate R.

19. The method of claim 17, wherein reaction conditions of the solid diffusion reaction are selected such that an atomic concentration of tin in an Nb$_3$Sn phase of the superconducting filament is at least 23% or at least 24%.

* * * * *